(12) United States Patent
Alves et al.

(10) Patent No.: US 9,166,587 B2
(45) Date of Patent: Oct. 20, 2015

(54) SOFT ERROR RESILIENT FPGA

(71) Applicant: International Business Machines Corporation, Armonk, NY (US)

(72) Inventors: Luiz C. Alves, Hopewell Junction, NY (US); William J. Clarke, Poughkeepsie, NY (US); K. Paul Muller, Wappingers Falls, NY (US); Robert B. Tremaine, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 272 days.

(21) Appl. No.: 13/800,716

(22) Filed: Mar. 13, 2013

(65) Prior Publication Data

US 2013/0265080 A1 Oct. 10, 2013

Related U.S. Application Data

(62) Division of application No. 13/352,900, filed on Jan. 18, 2012, now Pat. No. 8,513,972.

(51) Int. Cl.
*H03K 19/003* (2006.01)
*H03K 19/177* (2006.01)

(52) U.S. Cl.
CPC .... *H03K 19/00315* (2013.01); *H03K 19/17764* (2013.01)

(58) Field of Classification Search
None
See application file for complete search history.

(56) References Cited

U.S. PATENT DOCUMENTS

| | | | |
|---|---|---|---|
| 4,805,148 A * | 2/1989 | Diehl-Nagle et al. | 365/154 |
| 6,822,894 B1 | 11/2004 | Costello et al. | |
| 6,982,451 B1 | 1/2006 | Voogel et al. | |
| 7,111,215 B1 | 9/2006 | Keller et al. | |
| 7,139,190 B1 * | 11/2006 | de Jong | 365/154 |
| 7,143,329 B1 | 11/2006 | Trimberger et al. | |
| 7,265,573 B1 | 9/2007 | Wright | |
| 7,301,796 B1 | 11/2007 | Voogel et al. | |
| 7,386,826 B1 | 6/2008 | Keller et al. | |
| 7,465,971 B2 | 12/2008 | Sidhu et al. | |
| 7,746,682 B2 | 6/2010 | Oliva et al. | |
| 7,868,646 B1 * | 1/2011 | Sharpe-Geisler et al. | 326/14 |
| 7,948,791 B1 * | 5/2011 | de Jong | 365/154 |
| 8,191,021 B2 | 5/2012 | Rezgui | |

(Continued)

OTHER PUBLICATIONS

Alderighi, M. et al., "Evaluation of Single Event Upset Mitigation Schemes for SRAM based FPGAs using the FLIPPER Fault Injection Platform", 22nd IEEE International Symposium on Defect and Fault Tolerance in VLSI Systems, p. 105-113, 2007.

(Continued)

*Primary Examiner* — Anh Tran
(74) *Attorney, Agent, or Firm* — Cantor Colburn LLP; Margaret McNamara

(57) ABSTRACT

A field programmable gate array (FPGA) includes configuration RAM (CRAM) including at least one non-hardened portion and at least one hardened portion having an SER resilience greater than an SER resilience of the non-hardened portion.

5 Claims, 15 Drawing Sheets

(56) References Cited

U.S. PATENT DOCUMENTS

| | | |
|---|---|---|
| 2007/0176627 A1 | 8/2007 | Ng et al. |
| 2007/0198892 A1 | 8/2007 | Ng et al. |
| 2009/0134925 A1 | 5/2009 | Cannon et al. |
| 2010/0213548 A1 | 8/2010 | Chang et al. |
| 2010/0301446 A1 | 12/2010 | Cannon et al. |
| 2010/0301447 A1 | 12/2010 | Yu et al. |
| 2011/0088008 A1* | 4/2011 | Fifield et al. .................. 716/136 |
| 2011/0102042 A1* | 5/2011 | Cannon et al. ................ 327/199 |
| 2011/0177660 A1 | 7/2011 | Barth, Jr. et al. |

OTHER PUBLICATIONS

Asadi, G.H., et al., "Soft Error Mitigation for SRAM-Based FPGAs", Proceedings of the 23rd IEEE Test Symposium, p. 1-6, 2005.

Yui, C.C. et al., "SEU Mitigation Testing of Xilinx Virtex II FPGAs", Radiation Effects Data Workshop, IEEE, p. 92-97, 2003.

* cited by examiner

SOFT ERROR RESILIENT FPGA

CROSS-REFERENCE TO RELATED APPLICATION

This application is a divisional of U.S. patent application Ser. No. 13/352,900, filed Jan. 18, 2012, now U.S. Pat. No. 8,513,972, the disclosure of which is incorporated by reference herein in its entirety.

BACKGROUND

The present invention relates to field programmable gate arrays (FPGAs), and more specifically, to FPGAs resistant to soft errors.

FPGAs are programmable devices that are customizable by users to program particular logic into the FPGAs. FPGAs are composed of configurable logic blocks (CLBs) connected by an interconnect structure and surrounded by configurable I/O blocks (IOBs). Each CLB may include configuration memory cells to control the functions performed by the CLB. The configuration memory cells may include lookup tables (LUTs), or truth tables implementing combinational logic.

In memory circuits, including FPGAs, soft errors affect memory when one or more energetic particles bombard one or more transistors to switch on the transistor for a short period of time. In addition, the energetic particles may change a stored value. When a soft error occurs in configuration logic, the logical operation performed by the configuration logic may be changed.

SUMMARY

According to one embodiment of the present invention, a field programmable gate array (FPGA) comprises configuration RAM (CRAM) including at least one non-hardened portion and at least one hardened portion having a soft error (SER) resilience greater than an SER resilience of the non-hardened portion.

According to another embodiment of the present invention, a system comprises an FPGA having a hardened portion and a non-hardened portion and a mapper to map first logic to the hardened portion and second logic to the non-hardened portion.

According to yet another embodiment of the present invention, a method includes detecting an identifier in configuration instructions and mapping configuration logic associated with the identifier into a hardened portion of an FPGA including both the hardened portion and a non-hardened portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings.

DETAILED DESCRIPTION

Figure 1:
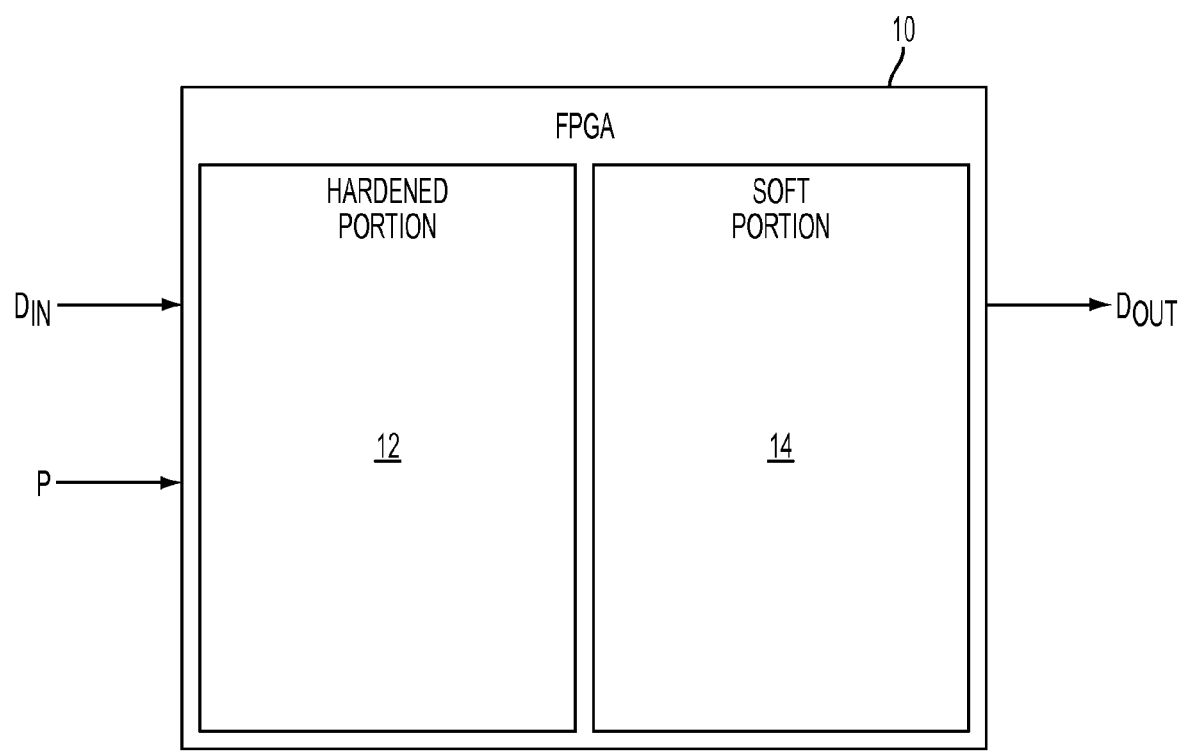
FIG. 1 is a block diagram of an FPGA according to one embodiment.

With reference now to FIG. 1, a field programmable gate array (FPGA) 10 receives as an input data ($D_{IN}$) and outputs data ($D_{OUT}$). Program data (P) is input to the FPGA 10 to program the logic and any other functions of the FPGA 10. The FPGA 10 may be static random access memory (SRAM), designated configuration random access memory, or CRAM. The CRAM may include parity bits and ECC correction to detect data errors, such as soft errors generated by energetic particles changing values of bits in the CRAM. In addition, ECC correction may detect errors and correct single flips of bit values in the CRAM due to soft errors. In some embodiments of the present invention, portions of the FPGA 10 that correspond to ECC correction and parity protection may utilize interleaving of bits to protect the ECC correction and parity protection portions from soft errors.

The FPGA 10 includes a hardened portion 12 and a non-hardened portion 14, which is also referred to as a soft portion 14. The hardened portion 12 refers to a portion that is constructed, reinforced, or programmed to protect against soft errors, or to be soft error (SER) resilient. The soft portion 14 refers to a portion that is constructed or programmed to have less protection against soft errors than the hardened portion 12, or to be less SER resilient than the hardened portion 12.

For example, the hardened portion 12 may be formed as silicon-on-insulator (SOI), may be designed to employ transistor stacking, such as in-line stacking, may employ parity or ECC protection combined with interleaving, may be made of a different type of device than the soft portion 14, may include capacitors, or may be logically hardened such by combining interlocking memory cells to form one memory cell, to prevent or reduce soft errors. The soft portion 14 may include some or none of the above features to reduce soft errors, and the soft portion 14 has an SER resilience less than the hardened portion 12. Memory cells in the soft portion 14 may take up less area in a chip than memory cells of the hardened portion 12. In one embodiment, the hardened portion 12 is formed using SOI, while the soft portion 14 is formed using bulk CMOS techniques that do not include SOI. In another embodiment, both the hardened portion 12 and the soft portion 14 may be formed using SOI, but only the hardened portion may include additional protections, such as transistor stacking. The hardened portion 12 and the soft portion 14 may have any combination of soft error protection features, although the soft portion 14 may have fewer soft error protection features than the hardened portion 12, and the soft portion 14 may also have no soft error protection features.

In one embodiment, the hardened portion 12 includes one or more of embedded dynamic random access memory (EDRAM), flash memory, PCM, hardened latches, fuses, or other SER tolerant devices, and the soft portion 14 does not include one of such devices. For example, the soft portion 14 may include only conventional static RAM (SRAM). In other words, in one embodiment, the hardened portion 12 and the soft portion 14 comprise different types of memory within one chip or in different chips that are electrically connected to form one FPGA 10.

Although FIG. 1 illustrates the hardened portion 12 and the soft portion 14 as being side-by-side, in some embodiments the hardened portion 12 and the soft portion 14 are interspersed with each other. Thus, while according to some embodiments the hardened portion 12 and the soft portion 14 include different devices located side-by-side and electrically connected to form the FPGA 10, in other embodiments, the hardened portion 12 and the soft portion 14 are interspersed throughout the FPGA 10.

Figure 2:
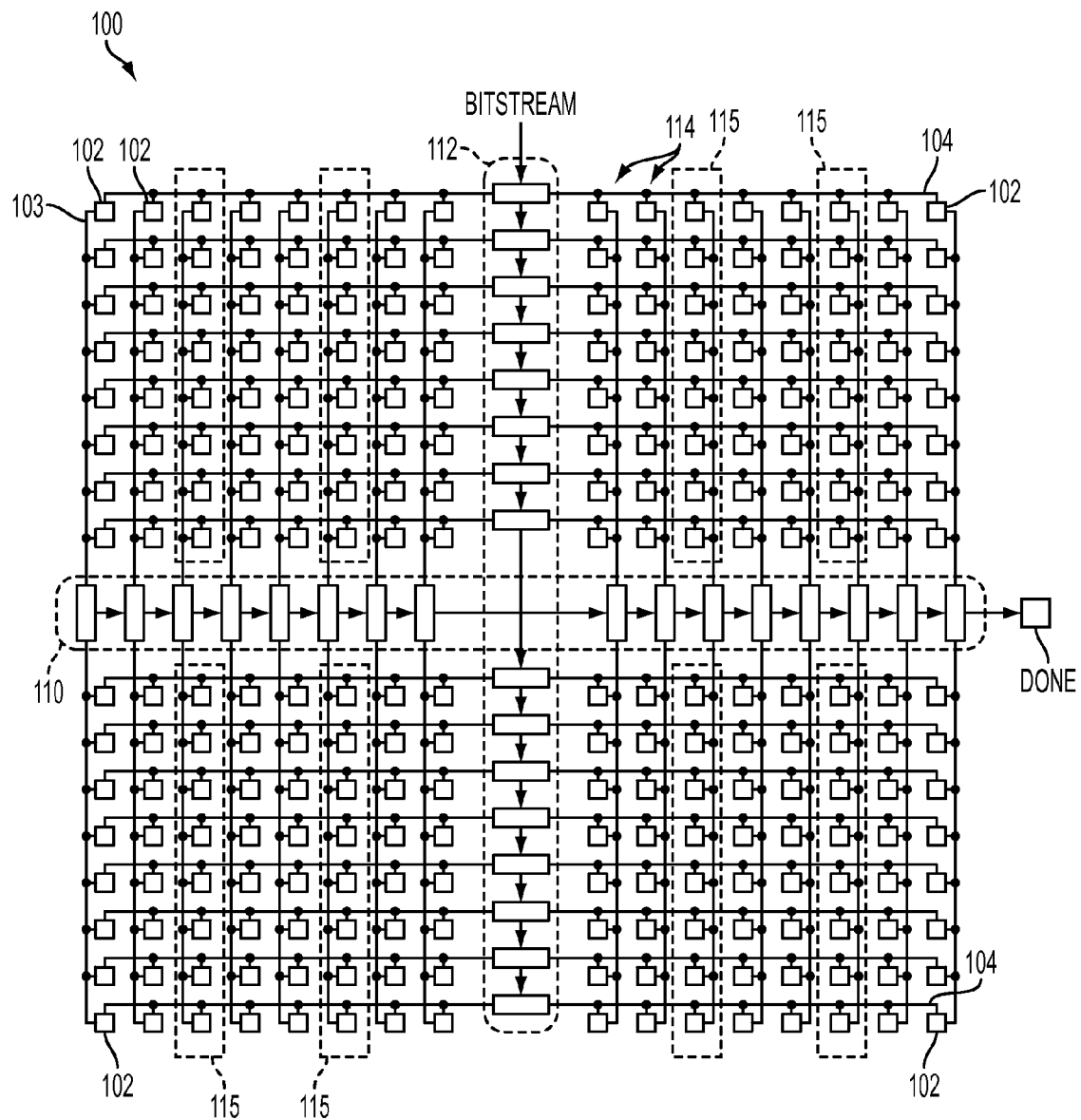
FIG. 2 is a diagram of an array of memory cells of an FPGA.

FIG. 2 illustrates an array 100 of memory cells 102 of an FPGA according to an embodiment of the present invention. The memory cells 102 may be configuration memory cells. The configuration memory cells 102 are arranged in an array and are connected to each other by address lines 103 and data lines 104. The configuration memory cells 102 are arranged into columns partitioned into logical frames of lookup table (LUT) memory. The array 100 also includes a data shift register 112 and an address shift register 110 to control configuration and logic operations of the configuration memory cells 102, and a DONE circuit to indicate that the configuration operation is done. In one embodiment, the array of configuration memory cells 102 includes hardened columns 115 interspersed among non-hardened columns 114. In other words, one array of configuration memory cells includes both columns with a relatively higher SER resilience and columns with a relatively lower SER resilience.

The hardened columns 115 may include features to increase SER resilience such as SOI, transistor stacking, adding capacitors, or logical hardening, such as by combining interlocking physical memory cells to form one logical memory cell. The non-hardened columns 114 may have none of these features, or fewer of these features than the hardened columns 115. As a result of one array 100 of memory cells 102 including both hardened columns 115 and non-hardened columns 114, the FPGA 10 of which the array 100 is a part provides SER resilience for only some of the configuration memory cells 102, resulting in greater SER resilience for some logic corresponding to the hardened columns 115 and greater memory cell density for logic corresponding to the non-hardened columns 114.

Figure 3A:
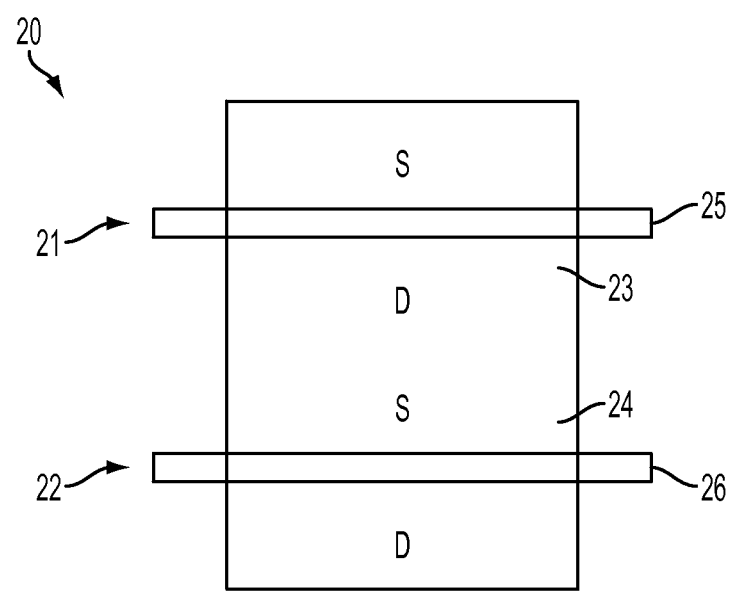
FIG. 3A is a diagram of two transistors stacked side-to-side according to one embodiment.
Figure 3B:
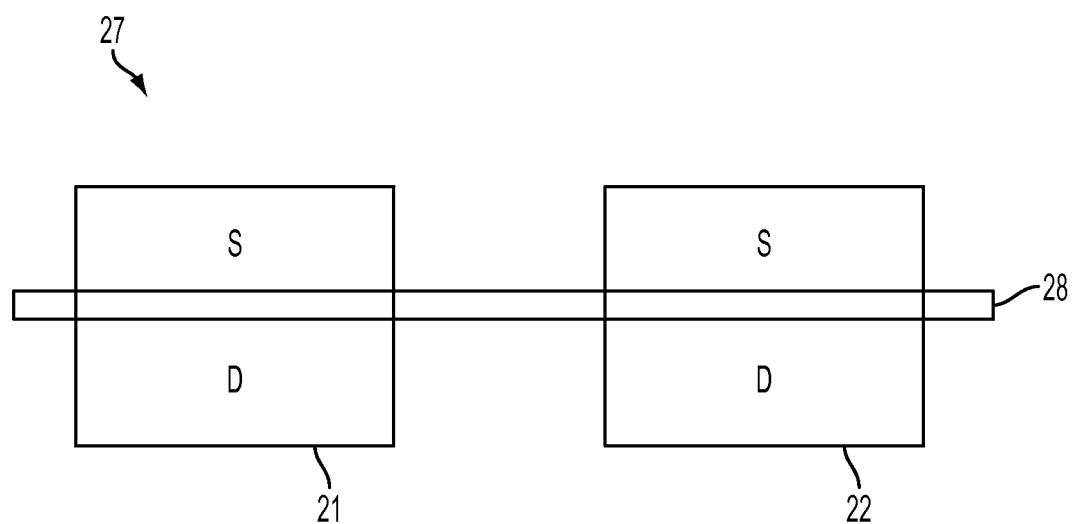
FIG. 3B is a diagram of two transistors stacked "in-line" according to one embodiment.

Each memory cell 102 may be made up of transistors, and the SER resilience of the memory cell 102 may be improved by stacking the transistors in either a side-to-side manner or an in-line manner. FIGS. 3A and 3B illustrate stacked transistors. FIG. 3A illustrates two transistors 21 and 22 arranged in a side-to-side manner, indicated by reference numeral 20. Both gates 25 and 26 are driven by the same node. The drain 23 of the upper transistor 21 is connected to or contiguous with the source 24 of the lower transistor 22. If one transistor of the pair is hit by an energized particle, the other still maintains the state of the circuit.

FIG. 3B illustrates the two transistors 21 and 22 arranged in an in-line manner indicated by reference numeral 27. Each transistor may be located on its own semiconductor island, for example, using SOI technology. As illustrated in FIG. 3B, when the transistors 21 and 22 are arranged in an in-line manner 27, the gate conductor 28 for both transistors 21 and 22 is arranged in a straight line. In one embodiment, such as illustrated in FIG. 3B, the gate conductor 28 is one continuous gate line. In another embodiment, the transistors 21 and 22 are arranged in line with separate collinear gate lines. Stacking the transistors 21 and 22, particularly in an in-line manner 27, improves an SER resilience of the stacked transistors 21 and 22 and the memory cells 102.

In some embodiments, the hardened portion 12 of the FPGA includes stacked transistors, such as in-line stacked transistors, and the non-hardened portion 14 does not include stacked transistors. In another embodiment, the hardened portion 12 includes in-line stacked transistors, and the non-hardened portion 14 includes side-to-side stacked transistors, such that the hardened portion 12 has a higher SER resilience than the non-hardened portion 14.

Figure 4:
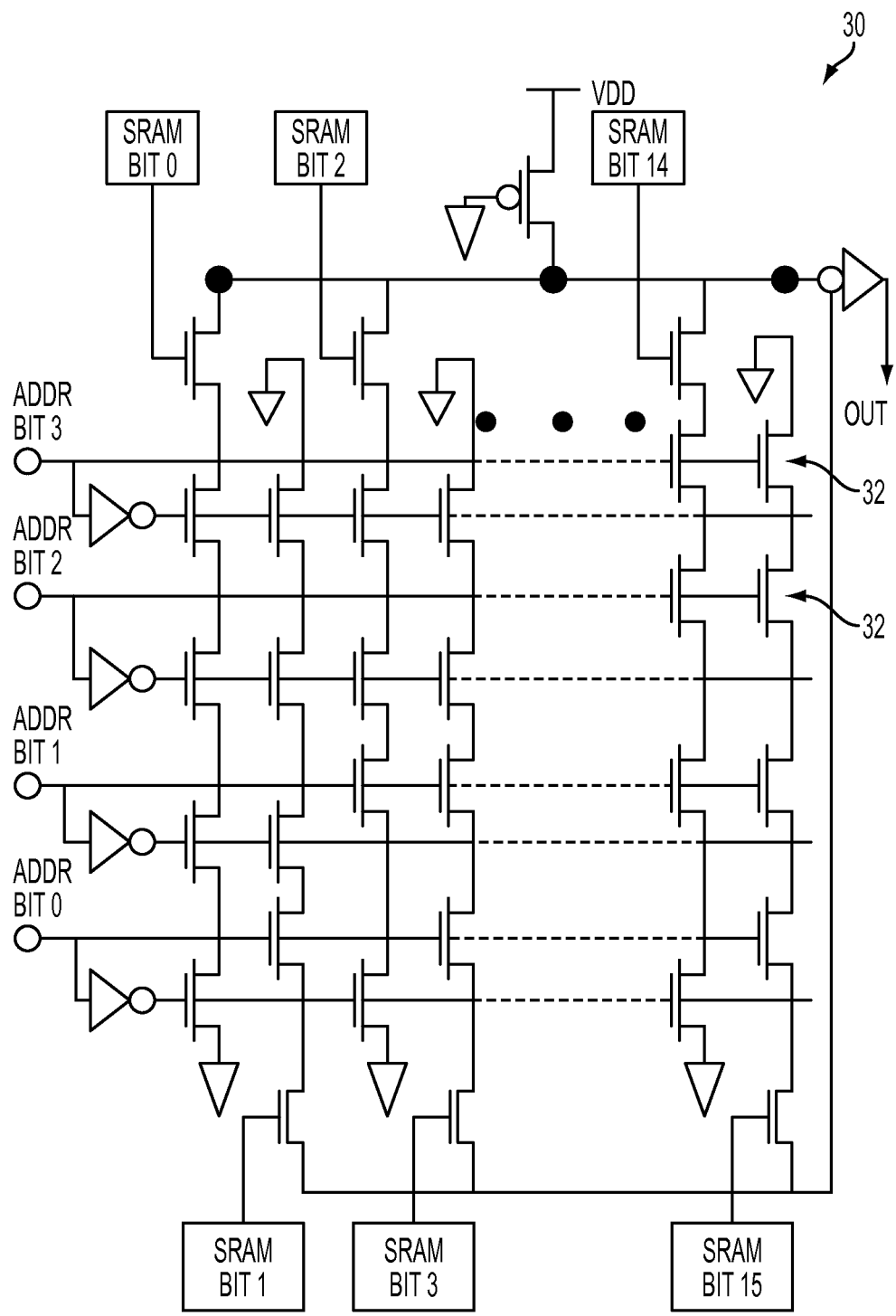
FIG. 4 is a diagram of transistors in a CLB of an FPGA according to one embodiment.

FIG. 4 illustrates an embodiment in which bits of SRAM, which may include CRAM, are interleaved to increase the SER resilience of the SRAM. Each bit of SRAM may comprise a series of transistors 32 connected source-to-drain, having gates connected to address bits (Addr Bit 0-Addr Bit 3). According to one embodiment, the interleaved bits are ECC bits. The bits (SRAM bit 0 to SRAM bit 15) are interleaved by physically separating consecutive bits. In other words, although SRAM bit 1 is schematically located between SRAM bit 0 and SRAM bit 2, SRAM bit 1 is not physically located between SRAM bit 0 and SRAM bit 2. Since consecutive bits are not located physically next to each other, soft errors caused by energetic particles do not affect two consecutive bits of a same word (i.e., SRAM bits 0 to 15). According to one embodiment, bits of data that are not ECC protected or parity protected are physically positioned between bits of data that are ECC protected or parity protected.

In one embodiment, the hardened portion 12 includes interleaved bits, and the non-hardened portion 14 does not include interleaved bits. In other words, bits of the non-hardened portion 14 are arranged consecutively in the physical SRAM. For example, in one embodiment, when both the columns 114 and 115 of FIG. 2 comprise SRAM, the hardened columns 115 may include interleaved SRAM bits, and the non-hardened columns 114 may include no interleaved SRAM bits. In another embodiment, the interleaved bits are interspersed throughout the CRAM of the FPGA 10, and the ECC protected bits and parity protected bits are mapped to the interleaved bits, while non-ECC protected and non-parity protected bits are mapped to the bits located physically between interleaved bits.

Figure 5:
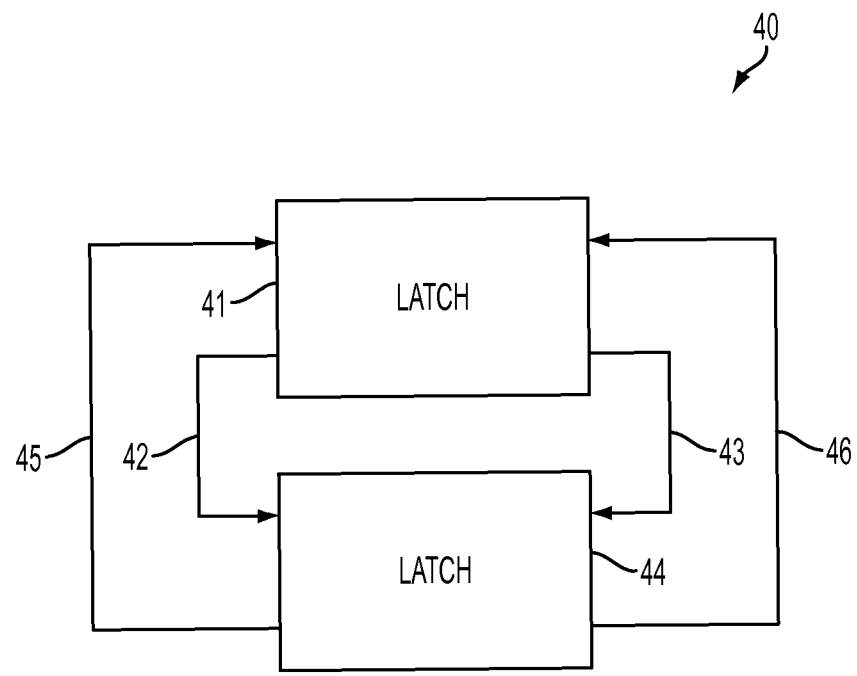
FIG. 5 is a block diagram of dual interlocked latches according to an embodiment of the present invention.

According to another embodiment, SRAM cells or latches of an FPGA 10 are logically hardened. FIG. 5 illustrates a block diagram of a logically hardened storage cell comprising latches, FIG. 6 illustrates a schematic diagram of a logically hardened storage cell comprising latches, and FIG. 7 illustrates a schematic diagram of a logically-hardened storage cell.

In FIG. 5, a hardened memory cell 40 comprises two interconnected latches 41 and 44. The latches 41 and 44 store the same data. Each latch 41 and 44 provides differential outputs to the other. Latch 41 provides differential outputs 42 and 43 to latch 44, and latch 44 provides differential outputs 45 and 46 to latch 41. During operation, data from an uncorrupted latch provides feedback to the corrupted latch to restore the corrupted data of the corrupted latch. The hardened memory cell 40 may include any type of physical structure, including a dual interlocked circuit element (DICE) structure.

In some embodiments, the memory cells 102 of FIG. 2 are configurable to be interlocked to form a hardened memory cell, such as the hardened memory cell 40 of FIG. 5. For example, a user may designate particular logic as priority logic, and a mapper may map the priority logic so that each memory cell 102 corresponding to the priority logic includes at least two physically separate memory cells 102 coupled to each other to form one hardened memory cell 40. Consequently, only the desired amount of memory of the FPGA 10 is hardened, preserving a maximum memory density of the rest of the FPGA 10.

Figure 6:
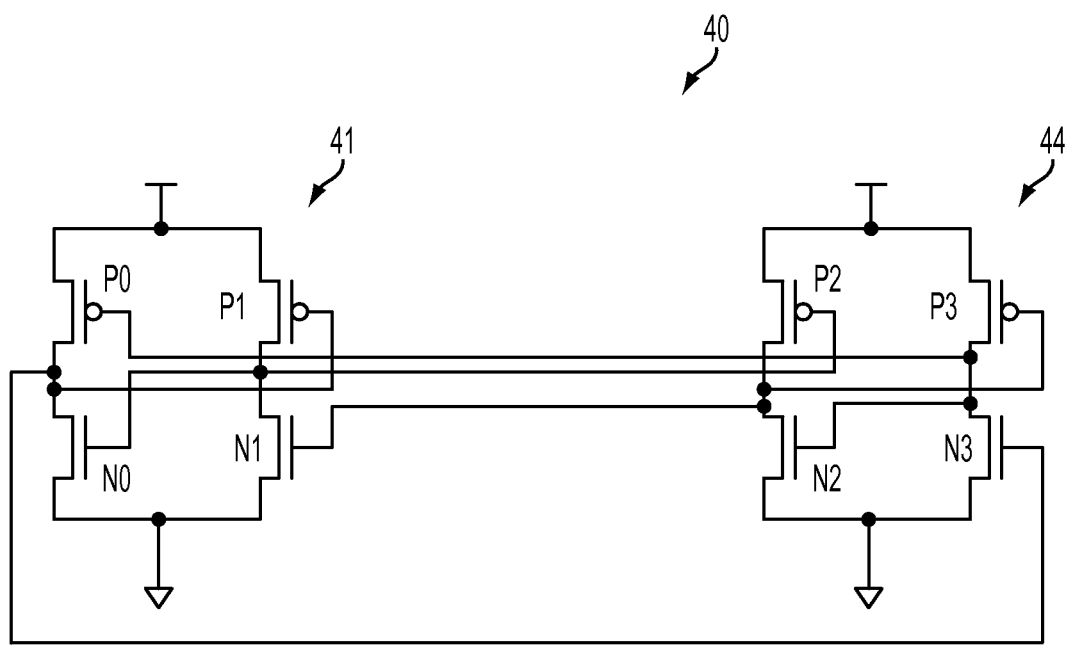
FIG. 6 is a circuit diagram of dual interlocked latches according to an embodiment of the present invention.
Figure 7:
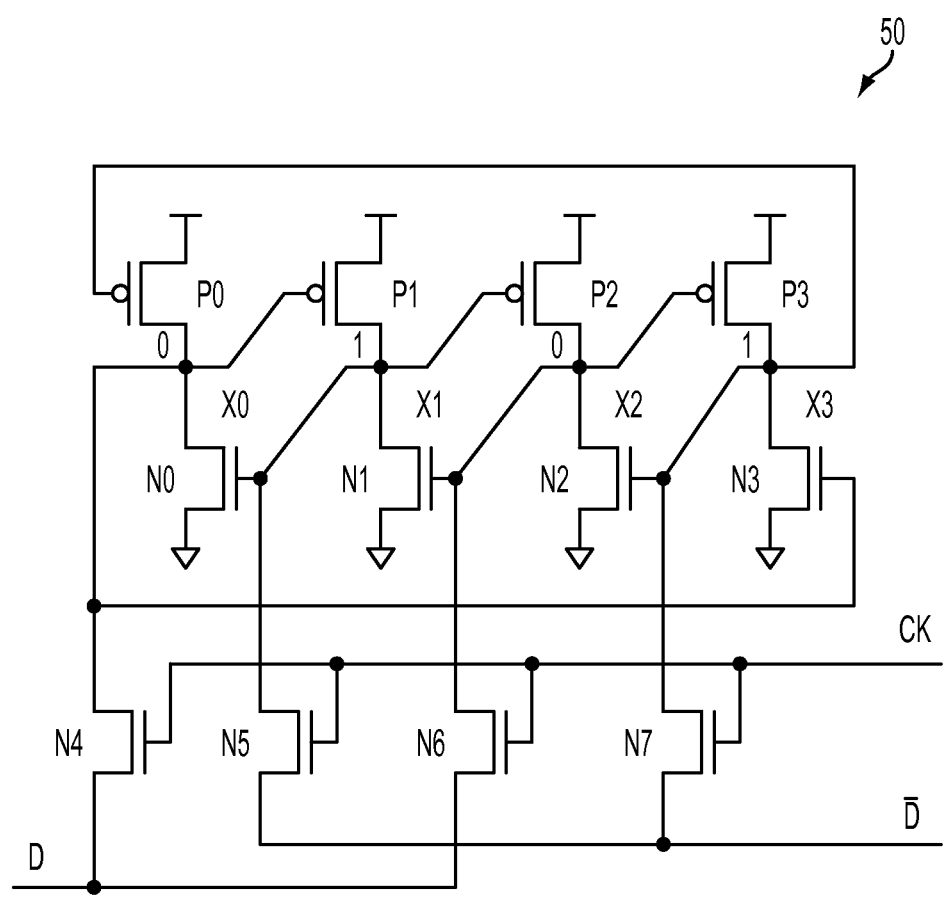
FIG. 7 is a schematic diagram of interlocked memory cells according to one embodiment.

FIG. 6 illustrates a circuit diagram of a hardened memory cell 40 corresponding to the block diagram of FIG. 5. A first latch 41 comprises a plurality of transistors connected to form the latch. The transistors may be pFET and nFET transistors. For example, the first latch 41 may comprise pFET transistors P0 and P1 and nFET transistors N0 and N1. Each pFET transistor P0 and P1 may be connected in series with a respective nFET transistor N0 and N1 source-to-drain, and the pairs of one nFET and one pFET transistor may be connected in parallel with each other between power and ground.

Similarly, the latch 44 may comprise pFET transistors P2 and P3, each connected in series with a respective nFET transistor N2 and N3. The pairs of one pFET and one nFET transistor may be connected in parallel with each other between power and ground. The latches 41 and 44 may be connected in the manner illustrated in FIG. 6 to form a hardened latch. In particular, a gate of one pFET transistor and one nFET transistor of one of the latches 41 and 44 may be connected to a node connecting a source and a drain of a pFET transistor and an nFET transistor of the other latch 41 or 44.

FIG. 7 illustrates a circuit diagram of a hardened memory cell 50 according to one embodiment. The hardened memory cell 50 may be formed, for example, on a bulk CMOS die or wafer, as opposed to an SOI die or wafer. The hardened memory cell 50 may correspond to a memory cell 102 of FIG. 2, for example. The hardened memory cell 50 includes latch structures N0-P1 and N2-P3 connected by bidirectional feedback inverters N1-P2 and N3-P0. Four nodes X0, X1, X2, and X3 store data as two pairs of complementary values which are simultaneously accessed in read or write operations. Transistors P0, P1, P2, and P3 form a first feedback loop, and transistors N0, N1, N2, and N3 form a second feedback loop. In the hardened memory cell 50 of FIG. 7, any soft error causing one node from among the four nodes X0, X1, X2, and X3 to change its state is not propagated to additional nodes, and the soft error is corrected or removed by reinforcing feedback from the additional nodes. Since methods to increase the SER resilience of an FPGA may increase an area of the FPGA, hardening only a portion of the FPGA may provide SER resilience while also maintaining the efficiency per unit of area of the FPGA. According to one embodiment, a user can determine which configuration logic to program into the hardened portion 12 of the FPGA 10, and which configuration logic to program into the non-hardened portion 14 of the FPGA 10.

Figure 8:
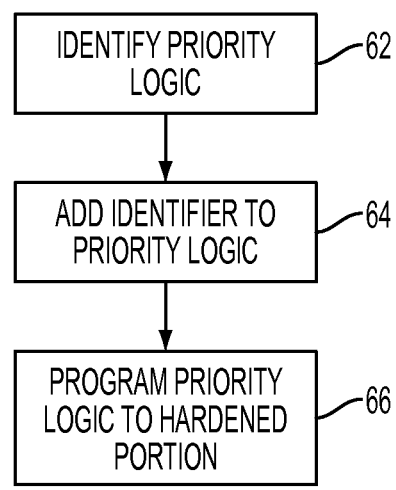
FIG. 8 is a flow diagram of a method of programming an FPGA according to an embodiment of the present invention.

FIG. 8 is a flow diagram of a method for programming configuration logic into a hardened portion 12 of an FPGA 10 having both a hardened portion 12 and a non-hardened portion 14. In operation 62, a user or program identifies priority logic. Priority logic may be logic that is particularly important to a device or program, based on predetermined design considerations of a user. For example, priority logic may correspond to logic that is often-used, that is vital to a large number of applications, or that is vital to one or more key applications or operating systems.

In operation 64, a user may add an identifier to the logic identified as priority logic. The identifier may be, for example, a key word or key symbol recognized by a mapper to tell the mapper that the associated configuration logic is priority logic. In an alternative embodiment, if a computer or program has determined that no priority logic has been identified, or that excess hardened memory cells exist, the computer or program may designate certain logic as "priority logic" to be mapped to the hardened portion 12 of the FPGA 10. For example, the computer or program may be pre-programmed to map certain types of data to the hardened portion 12. In one embodiment, the computer or program identifies state machines or error detection and correction circuits, programs, or data as priority logic to be programmed to the hardened portion 12.

In operation 66, the priority logic is programmed to the hardened portion 12. For example, a user may provide the priority logic including the identifier to a mapper, such as by causing a computing device to electronically transmit the desired logic to a mapper in the form of configuration instructions.

Figure 9:
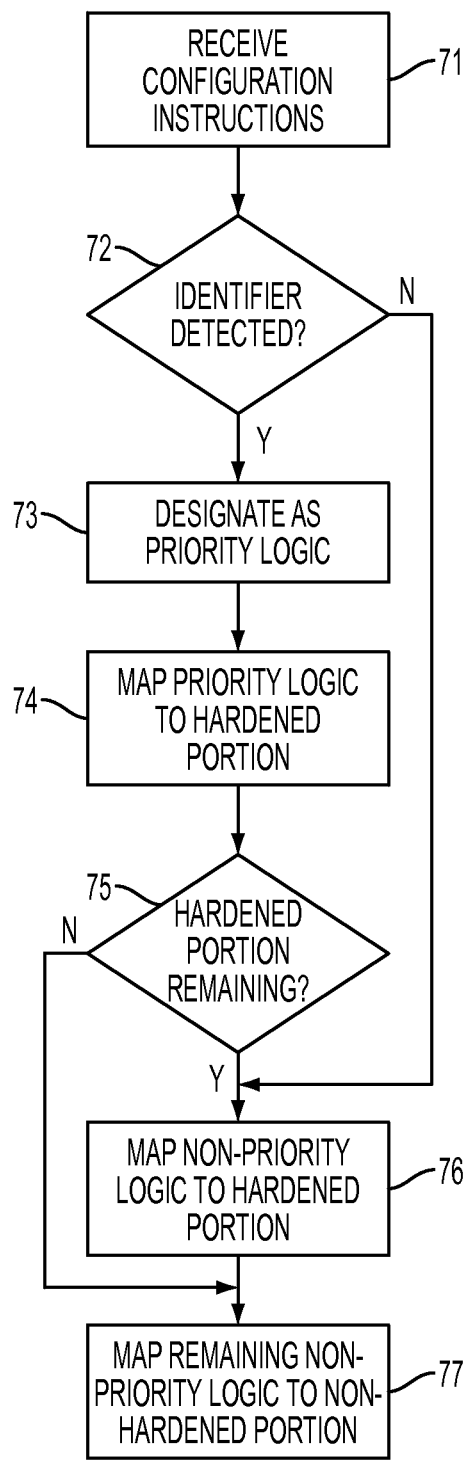
FIG. 9 is a flow diagram of a method to map logic to an FPGA according to an embodiment of the present invention.

FIG. 9 is a flow diagram of a method of mapping configuration logic to a hardened portion of an FPGA 10 having both a hardened portion 12 and a non-hardened portion 14. In operation 71, a mapper receives instructions to configure the FPGA 10. The instructions may include identifiers to designate configuration logic as priority logic. In operation 72, the mapper identifies the identifiers in the instructions. In operation 53, the mapper designates the identified logic as priority logic. If, in operation 72, no identifiers are found in the configuration instructions, then the non-designated logic is determined to be non-priority logic. The non-priority logic (as indicated by not being associated with an identifier) may be mapped to a hardened portion 12 of an FPGA 10 or may be mapped directly to a non-hardened portion 14 of the FPGA. However, if identifiers are detected in operation 72, and priority logic is designated in operation 73, the mapper maps the priority logic to the hardened portion 12 in operation 74.

In one embodiment, the mapper may detect in operation 75 whether there is any unused hardened portion 12 of the FPGA 10 after all of the configuration logic designated as priority logic is mapped to the FPGA 10. If it is determined in operation 75 that some of the hardened portion 12 remains unused, the mapper may map non-priority logic to the unused hardened portion 12. On the other hand, if it is determined in operation 75 that no unused hardened portion 12 remains, the remaining non-priority logic 77 may be mapped to the non-hardened portion 14.

Figure 10:
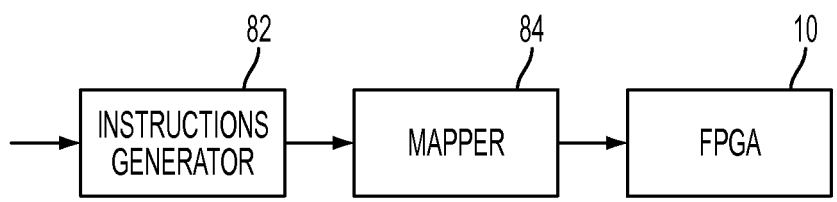
FIG. 10 is a block diagram of a system to map configuration logic onto an FPGA according to an embodiment of the present invention.

FIG. 10 illustrates a system to program an FPGA 10. An instructions generator 82 generates instructions for a mapper 84. The instructions generator 82 receives a user input, or an input from another device, to program the FPGA 10. The user input or device input includes at least logic to be programmed to the FPGA 10. The mapper 84 receives the instructions from the instructions generator 82 and maps logic to the FPGA 10. According to one embodiment, the mapper 84 detects priority logic in the instructions from the instructions generator 82 and programs the priority logic to the FPGA 10. For example, the mapper 84 may detect identifiers in the instructions indicating priority logic and may program the priority logic to a hardened portion of the FPGA 10.

The instructions generator 82 and mapper 84 may each comprise a computer, or may be part of a same computer. The instructions generator includes at least a user input, such as a keyboard, keypad, or touch screen, or a device input, such as a wired port or a wireless antenna. The user or device input provides the configuration data to generate the instructions. The instructions generator further comprises a data processor to convert the user or device input to instructions readable by the mapper 84.

The mapper 84 includes at least a data processor and memory. The memory may store information regarding programming the FPGA 10, including addresses of hardened and non-hardened, or soft, portions of the FPGA 10. The data processor receives the instructions from the instructions generator 82, and generates configuration data to map configuration logic from the instructions generator 82 to particular addresses of the FPGA 10. When the mapper 84 determines that particular configuration logic is priority logic, the data processor assigns the particular logic to an address of the FPGA 10 corresponding to a hardened portion 12 of the FPGA 10.

Figure 11:
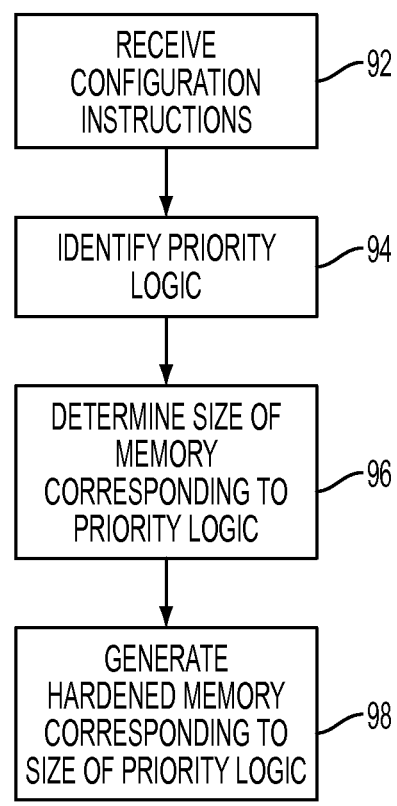
FIG. 11 is a flow diagram of a method of generating hardened memory cells according to one embodiment of the present invention.

FIG. 11 is a flow diagram illustrating a method of configuring memory cells to be hardened memory cells. In operation 92, configuration instructions are received, for example, by a mapper that maps logic and data to configuration memory cells of an FPGA 10. In operation 94, priority logic is identified based on the configuration instructions. For example, the configuration instructions may designate some logic as priority logic with a keyword, key symbol, or other designator, and the configuration instructions may not designate other logic as priority logic. The logic that is identified as priority logic is identified by the mapper or other computing device that programs the FPGA 10.

In operation 96, the configuration memory requirements corresponding to the sum of the priority logic are calculated. In operation 98, the mapper or other computing device generates hardened configuration memory in the FPGA 10 and maps the priority logic to the hardened configuration memory, while mapping non-priority logic to non-hardened configuration memory. For example, the mapper or other computing device may generate hardened configuration memory by combining two or more configuration memory cells together to form hardened configuration memory cells, such as in FIGS. 5 and 6. Consequently, sufficient hardened configuration memory is generated to accommodate the priority logic, but the non-hardened portion 14 of the FPGA 10 is maximized to maintain memory density by not generating excess hardened configuration memory. In other words, once a data size of the priority logic is determined, the hardened portion 12 of the FPGA 10 is generated to accommodate the priority logic, and the remainder of the FPGA 10 is maintained as the non-hardened portion 14.

In another embodiment, hardened memory is generated in operation 98 to accommodate all of the priority logic and a calculated amount of the non-priority logic. For example, if sufficient configuration memory, such as CRAM, exists on the FPGA 10 to accommodate all of the priority logic within a hardened portion 12, and the non-priority logic and data storage requires only 60% of the remaining configuration memory on the FPGA 10, then a mapper or other computing device may calculate the maximum amount of hardened configuration memory that may be generated such that all of the non-priority logic may be accommodated on the FPGA 10. Consequently, some of the non-priority logic may then be mapped onto hardened configuration memory, while the rest may be mapped into non-hardened configuration memory. By this embodiment, a maximum amount of hardened configuration memory is generated while still accommodating all of the configuration logic defined within the configuration instructions.

According to the above embodiments, an SRAM cell, and in particular a CRAM cell, may be hardened to protect against soft errors, which may result in an increase in the area of the SRAM cell. In some embodiments, an SRAM cell may be half-hardened to improve an SER resilience of one state (1 or 0) of the SRAM cell while taking up a smaller area than a fully-hardened SRAM cell.

Figure 12:
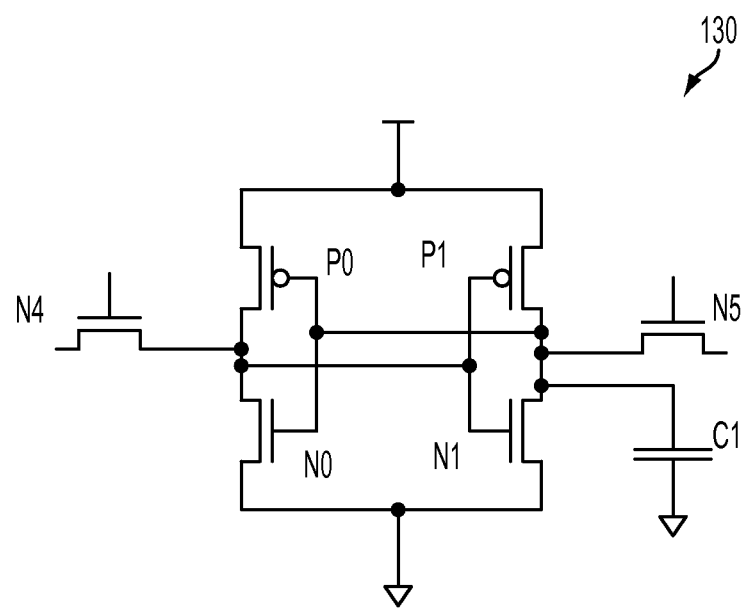
FIG. 12 illustrates a half-hardened SRAM cell according to an embodiment of the invention.

FIG. 12 illustrates a half-hardened SRAM cell 130 according to an embodiment of the present invention. An SRAM cell 130 according to an embodiment of the present invention includes FET transistors to store bits of data. In particular, the SRAM cell 130 of FIG. 12 includes a pFET $P_0$ connected in series with an nFET $N_0$, and a pFET $P_1$ connected in series with an nFET $N_1$. The pairs of FET transistors are connected in parallel with each other. Transistors $N_4$ and $N_5$ may be connected between the transistors of the respective pairs to change the data stored in the SRAM cell 130 and the read data stored in the SRAM cell 130. The SRAM cell 130 may be hardened by supplying a capacitor $C_1$ at a junction of two transistors of a pair. For example, in FIG. 12, a capacitor $C_1$ is provided between the transistors $P_1$ and $N_1$.

An SRAM cell is usually symmetrical and flips as easily from a "0" to a "1" as from a "1" to a "0". The SER fail rates of symmetrical SRAM cells are independent of the stored data polarity. However, when only half of the SRAM cell 130 is hardened by providing the capacitor $C_1$ between the transistors $P_1$ and $N_1$, and by not providing a corresponding capacitor between the transistors $P_0$ and $N_0$, the SRAM cell 130 may be designed to hold one value (1 or 0) better than the other value (of the values 1 and 0). In other words, the SRAM cell is protected better from a change in state from one value (1 or 0) to the other value (of the values 1 and 0) than vice versa. For example, the SRAM cell may be configured so that a stored value is less likely to change from a 0 to a 1 due to a soft error than from a 1 to a 0.

Figure 13:
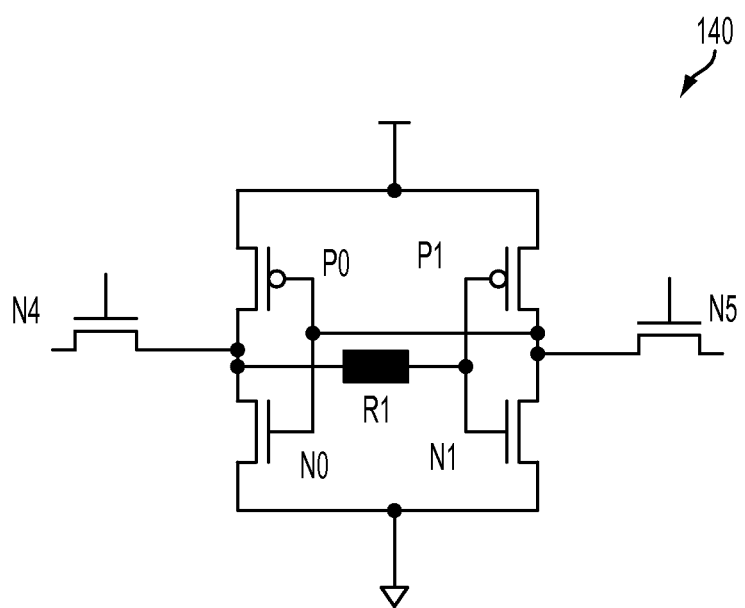
FIG. 13 illustrates a half-hardened SRAM cell according to another embodiment of the invention.

While FIG. 12 illustrates a half-hardened SRAM cell 130 utilizing a capacitor C1 to provide a hardening characteristic, any other hardening method may be utilized. FIG. 13 illustrates a half-hardened SRAM cell 140 utilizing a resistor or resistive element R1 as a hardening feature. The structure of the SRAM cell 140 of FIG. 13 is similar to the SRAM cell 130 of FIG. 12, except instead of the capacitor $C_1$ connected between the transistors $P_1$ and $N_1$, a resistor or resistive element $R_1$ is provided between power and the transistor $P_1$. Since no similar resistor is provided between power and the transistor $P_0$, the SRAM cell 140 is half-hardened, providing protection against soft errors causing a transition from one state (1 or 0), while not providing protection against soft errors causing a transition from the other state (of the states 1 or 0).

Figure 14:
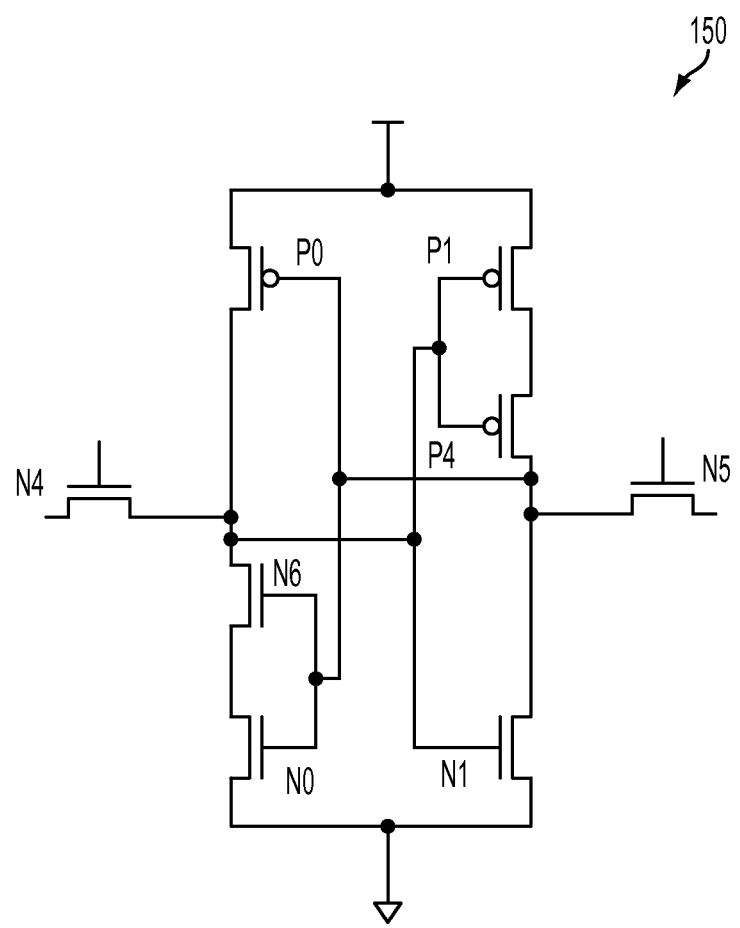
FIG. 14 illustrates half-hardened stacked SRAM cells according to an embodiment of the invention.

FIG. 14 illustrates yet another embodiment of a half-hardened SRAM cell 150. The half-hardened SRAM cell 150 includes asymmetrically stacked transistors to harden the memory cell 150. In particular, transistor $N_6$ may be connected parallel to, and stacked with respect to, transistor $N_0$. Likewise, transistor $P_4$ may be connected parallel to, and stacked with respect to, transistor $P_1$. Since corresponding stacked transistors are not provided for transistors P0 and N1, the SRAM cell 150 is asymmetrically hardened. In other words, the SRAM cell 150 may hold one state (1 or 0) better than the other state (of the states 1 and 0).

The above embodiments describing half-hardened SRAM cells 130, 140, and 150 provide improved SER resilience with respect to one state (1 or 0) and not with respect to the other state (of the states 1 and 0). In addition, compared to a fully-hardened SRAM cell, a half-hardened SRAM cell uses up less area. Consequently, during a mapping operation of CRAM cells of an FPGA, a user or a mapper may determine whether particular logic may be asymmetrically hardened, and may map that particular logic to the asymmetrically hardened CRAM cells of the FPGA.

According to the above embodiments, an FPGA may include both a hardened portion and a non-hardened portion. The hardened portion may provide increased SER resilience for some of the logic programmed into the FPGA and, in some embodiments, a user may designate particular logic as priority logic to be programmed into the hardened portion. However, the non-hardened portion may have an increased density of memory cells in the FPGA relative to the hardened portion. Thus, an FPGA of the above embodiments of the present invention both provides increased SER protection relative to an FPGA having only non-hardened memory cells and maintains a higher memory cell density than an FPGA comprising only hardened memory cells. In addition, since a user can select in which program to map logic, a user can utilize the hardened portion to protect logic that the user designates as priority logic, based on design considerations of the circuit.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field programmable gate array (FPGA), comprising:
   configuration RAM (CRAM) including at least one non-hardened portion and at least one hardened portion having a soft error (SER) resilience greater than an SER resilience of the non-hardened portion;
   wherein the hardened portion comprises half-hardened CRAM cells, comprising a first asymmetric transistor stack having a single pFET connected in series with a pair of nFETs, and a second asymmetric transistor stack cross-coupled to the first asymmetric transistor stack, the second asymmetric transistor stack having a pair of pFETs connected in series with a single nFET.

2. The FPGA of claim 1, wherein the hardened portion is static random access memory (SRAM) and the hardened portion includes interleaved SRAM error correction coding (ECC) bits.

3. The FPGA of claim 2, wherein the non-hardened portion is SRAM and does not include interleaved SRAM ECC bits.

4. The FPGA of claim 1, wherein the hardened portion comprises at least one SER tolerant device, and the non-hardened portion does not include an SER tolerant device.

5. The FPGA of claim 4, wherein the SER tolerant device includes at least one of embedded dynamic random access memory (EDRAM), flash memory, hardened latches, and fuses.

* * * * *